(12) United States Patent
Hisaka et al.

(10) Patent No.: US 8,766,445 B2
(45) Date of Patent: Jul. 1, 2014

(54) SEMICONDUCTOR DEVICE

(75) Inventors: Takayuki Hisaka, Tokyo (JP); Takahiro Nakamoto, Tokyo (JP); Toshihiko Shiga, Tokyo (JP); Koichiro Nishizawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 81 days.

(21) Appl. No.: 13/525,433

(22) Filed: Jun. 18, 2012

(65) Prior Publication Data

US 2013/0093061 A1  Apr. 18, 2013

(30) Foreign Application Priority Data

Oct. 12, 2011 (JP) .................... 2011-224521

(51) Int. Cl.
*H01L 23/48* (2006.01)

(52) U.S. Cl.
USPC ............ 257/760; 257/741; 257/750; 257/758; 257/763; 257/768; 438/622; 438/624; 438/634; 438/639; 438/619

(58) Field of Classification Search
USPC ......... 257/741, 750, 758, 760, 763, 768, 770, 257/776, 774, E21.575, E31.579, E21.584; 438/622, 624, 634, 639, 643, 619
See application file for complete search history.

(56) References Cited

U.S. PATENT DOCUMENTS

| 5,677,574 A | 10/1997 | Hisaka |
| 6,303,999 B1 | 10/2001 | Ro et al. |
| 2002/0005583 A1 | 1/2002 | Harada et al. |
| 2004/0017701 A1 | 1/2004 | Asano et al. |
| 2010/0164103 A1* | 7/2010 | Hishida et al. ............... 257/745 |

FOREIGN PATENT DOCUMENTS

| JP | 63-204742 A | 8/1988 |
| JP | 1-262646 A | 10/1989 |
| JP | 8-288384 A | 11/1996 |
| JP | 10-289979 A | 10/1998 |
| JP | 2001-250861 A | 9/2001 |
| JP | 2003-309130 A | 10/2003 |

(Continued)

OTHER PUBLICATIONS

Brown J, et al.; "Optimization and Characterization of a Photo Definable BCB for HV3S and HVHBT Technologies", *CS MANTECH Conference*, Palm Springs, CA, (May 16-19, 2011).

(Continued)

*Primary Examiner* — Julio J Maldonado
*Assistant Examiner* — Cory Eskridge
(74) *Attorney, Agent, or Firm* — Leydig, Voit & Mayer, Ltd.

(57) ABSTRACT

A semiconductor device includes: a semiconductor substrate; an underlying wiring on the semiconductor substrate; a resin film extending to the semiconductor substrate and the underlying wiring, and having a first opening on the underlying wiring; a first SiN film on the underlying wiring and the resin film, and having a second opening in the first opening; an upper layer wiring on the underlying wiring and part of the resin film; and a second SiN film on the upper layer wiring and the resin film, and joined to the first SiN film on the resin film. The upper layer wiring includes a Ti film, connected to the underlying wiring via the first and second openings, and an Au film on the Ti film. The first and second SiN films circumferentially protect the Ti film.

5 Claims, 4 Drawing Sheets

(56) References Cited

FOREIGN PATENT DOCUMENTS

| | | |
|---|---|---|
| JP | 2010-153708 A | 7/2010 |
| KR | 10-0249047 B1 | 3/2000 |
| KR | 10-0412179 B1 | 12/2003 |

OTHER PUBLICATIONS

Korean Patent Office, Office Action in Korean Patent Application No. 10-2012-0102039 (Aug. 8, 2013).

* cited by examiner

SEMICONDUCTOR DEVICE

BACKGROUND OF THE INVENTION

1. Field of the Invention

The present invention relates to a semiconductor device and method for manufacturing the same which can improve the resistance to impurities or the like from the exterior.

2. Background Art

In MMIC (monolithic microwave IC), Ti/Au wirings are used (for example, refer to Japanese Patent Application Laid-Open No. 1-262646). A Ti film is relatively thin as several tens of nanometers, and is provided on the lowest layer to secure the adhesiveness with the lower layer. In addition, to lower the capacity between wirings, air-bridge wirings have been used. This is formed by Au plating after the Ti/Au power-supply layer has been formed by spattering.

SUMMARY OF THE INVENTION

The adhesiveness of a SiN film to a plating surface is low, and the coverage of an air-bridge wiring is poor. For this reason, the protection of the air-bridge wiring by the SiN film excellent in moisture resistance is difficult. Therefore, there is a case wherein the Ti film of the wiring is eroded and the resistance thereof is elevated by an impurity (Br, Cl, etc.) or $H_2O$ in the ambient air generated from surrounding assembly members. Furthermore, there is another case wherein impurities reach the surface of a semiconductor substrate, and the semiconductor substrate is eroded to cause operation failure.

In view of the above-described problems, an object of the present invention is to provide a semiconductor device and method for manufacturing the same which can improve the resistance to impurities or the like from the exterior.

According to the present invention, a semiconductor device includes: a semiconductor substrate; an underlying wiring on the semiconductor substrate; a resin film on the semiconductor substrate and the underlying wiring, and having a first opening on the underlying wiring; a first SiN film on the underlying wiring and the resin film, and having a second opening in a first opening; an upper layer wiring on the underlying wiring and a part of the resin film; and a second SiN film on the upper layer wiring and the resin film, and joined to the first SiN film on the resin film, wherein the upper layer wiring has a Ti film connected to the underlying wiring via the first and second openings, and an Au film on the Ti film, and the first and second SiN films protect a circumference of the Ti film.

The present invention makes it possible to improve the resistance to impurities or the like from the exterior.

Other and further objects, features and advantages of the invention will appear more fully from the following description.

DETAILED DESCRIPTION OF THE PREFERRED EMBODIMENTS

A semiconductor device and method for manufacturing the same according to the embodiments of the present invention will be described with reference to the drawings. The same components will be denoted by the same symbols, and the repeated description thereof may be omitted.

First Embodiment

Figure 1:
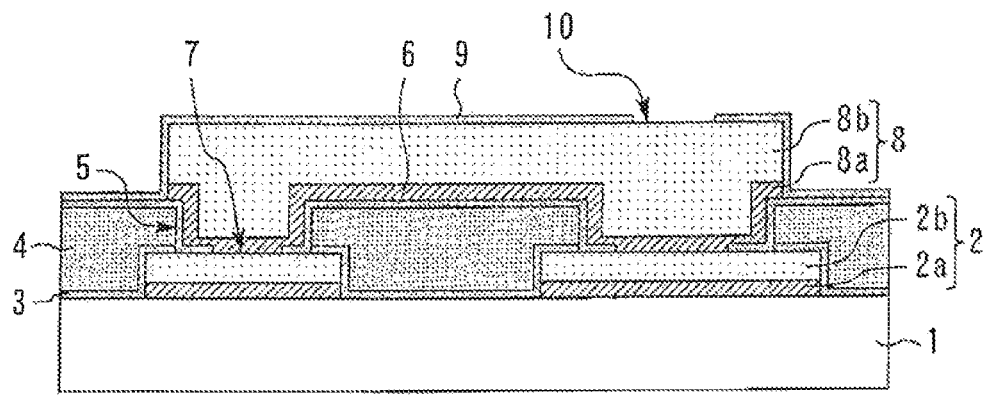
FIG. 1 is a sectional view showing a semiconductor device according to the first embodiment of the present invention.

FIG. 1 is a sectional view showing a semiconductor device according to the first embodiment of the present invention. An underlying wiring 2 is provided on a GaAs substrate 1. The underlying wiring 2 has a Ti film 2a, and an Au film 2b formed thereon. A SiN film 3 and a resin film 4 are provided on the GaAs substrate 1 and the underlying wiring 2. The SiN film 3 and the resin film 4 have openings 5 on the underlying wiring 2.

A SiN film 6 is provided on the underlying wiring 2 and the resin film 4. The SiN film 6 has an opening 7 in an opening 5. An upper layer wiring 8 is provided on the underlying wiring 2 and a part of the resin film 4.

The upper layer wiring 8 has a Ti film 8a connected to the underlying wiring 2 via openings 5 and 7, and an Au film 8b formed thereon. The upper layer wiring 8 is formed by vapor deposition. A SiN film 9 is joined to the SiN film 6 on the resin film 4. These SiN films 6 and 9 protect the circumference of the Ti film 8a.

A SiN film 9 is provided on the upper layer wiring 8 and the resin film 4. The SiN film 9 has an opening 10 on the upper layer wiring 8. A part of the upper layer wiring 8 exposed on the opening 10 is operated as a pad unit.

Figure 2:
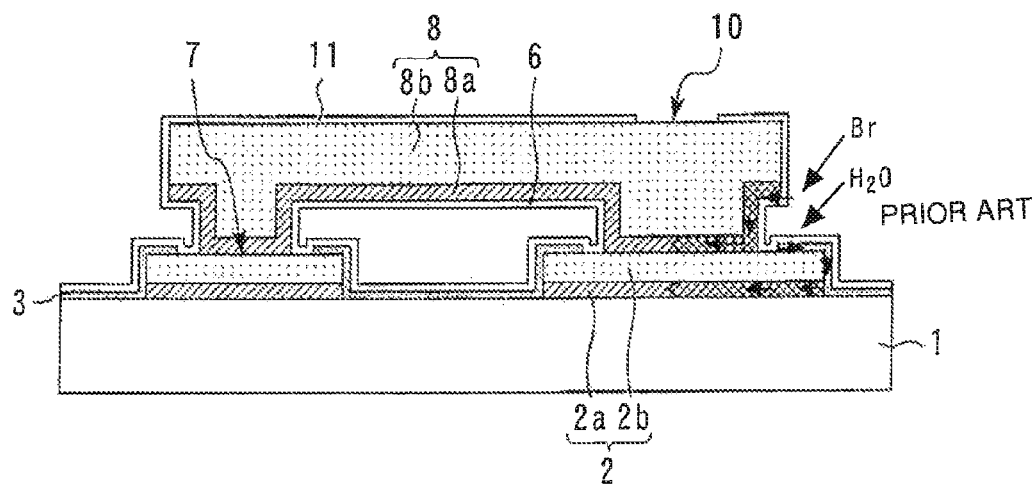
FIG. 2 is a sectional view showing a semiconductor device according to the comparative embodiment.

Next, the effect of the present embodiment will be described in comparison with a comparative embodiment. FIG. 2 is a sectional view showing a semiconductor device according to the comparative embodiment. In the comparative embodiment, the resin film 4 is absent, and in place of SiN films 6 and 9, the upper layer wiring 8 is protected by the SiON film 11. However, there is a case wherein Ti films 2a and 8a in the wiring are eroded by impurities (Br, Cl, etc.) generated from surrounding assembly members or $H_2O$ in the air, and resistance is elevated. Furthermore, there is another case where impurities reach the surface of the GaAs substrate 1, and the GaAs substrate 1 is eroded, which leads to operation failure.

In contrast, in the present embodiment, the surroundings of the Ti film 8a are protected by the SiN films 6 and 9 which are excellent in moisture resistance. Therefore, the invasion of impurities, such as Br, from the exterior can be inhibited, and the erosion of the Ti film 8a can be inhibited.

In addition, the adhesion of the SiN film 6 on the resin film 4 and the SiN film 9 covering the upper layer wiring 8 with each other is high. Therefore, even if the adhesion of the SiN film 9 to the upper layer wiring 8 is low, film peeling is hard to occur. Furthermore, in the structure in the present embodiment wherein the resin film 4 is provided, the coverage of the SiN films 6 and 9 is excellent in comparison with the air-bridge structure in the comparative embodiment. Therefore, the circumference of the Ti film 8a can be sufficiently protected by these SiN films 6 and 9. As a result, the resistance to impurities or the like from the exterior can be improved.

Second Embodiment

Figure 3:
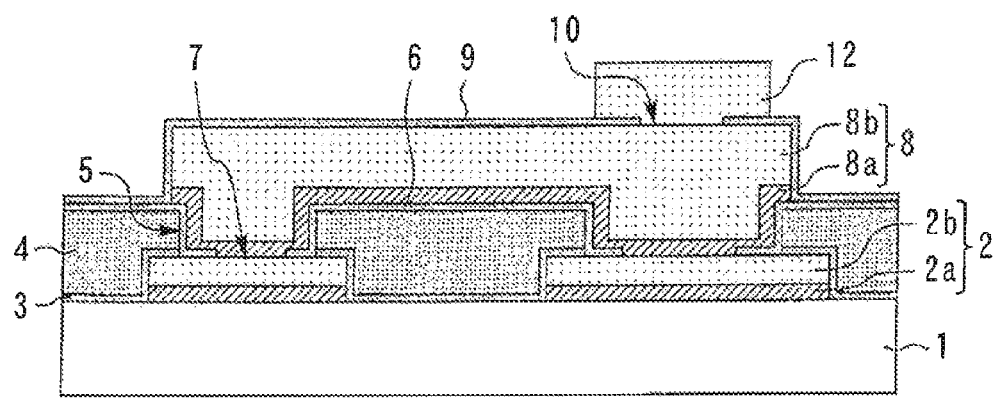
FIG. 3 is a sectional view showing a semiconductor device according to the second embodiment of the present invention.

FIG. 3 is a sectional view showing a semiconductor device according to the second embodiment of the present invention. A metal pad 12 is connected to an upper layer wiring 8 via an opening 10. The metal pad 12 is formed of an Au film. Other constitutions are identical to the constitutions of the first embodiment.

By the metal pad 12, the invasion of impurities such as Br from the interface between the upper layer wiring 8 and the SiN film 9 in the opening 10 can be inhibited. As a result, the resistance can be further improved.

Figure 4:
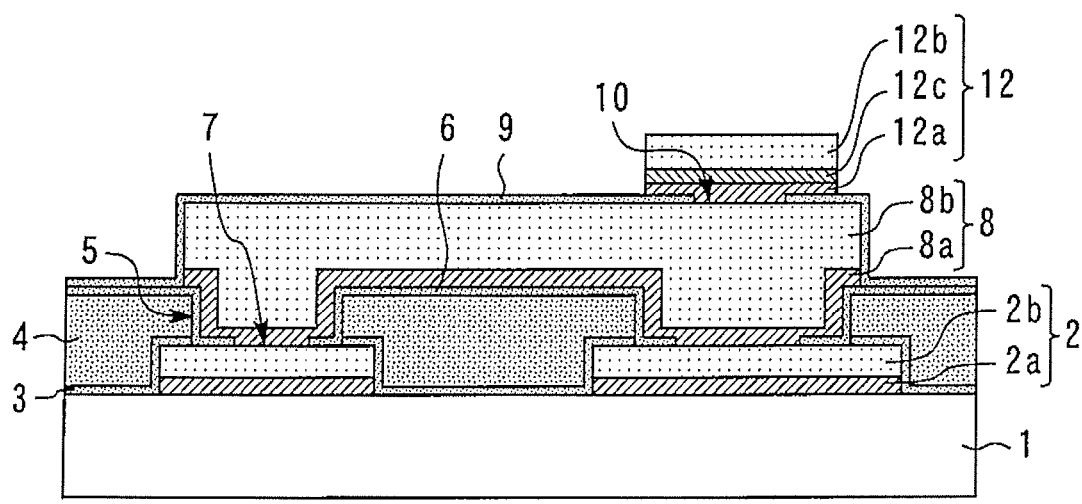
FIG. 4 is a sectional view showing a modification of a semiconductor device according to the second embodiment of the present invention.

FIG. 4 is a sectional view showing a modification of a semiconductor device according to the second embodiment of the present invention. The metal pad 12 consists of a Ti film 12a connected to the upper layer wiring 8, an Au film 12b, and a Pt film 12c provided between the Ti film 12a and the Au film 12b.

For ensuring adhesiveness, the thickness of the Ti film 12a is made to be about 50 nm. It is experimentally confirmed that the erosion of the Ti film 12a is inhibited by inserting the Pt film 12c having a thickness of 50 nm between the Ti film 12a and the Au film 12b. Specifically, when the chip was stored in the Br atmosphere of a temperature of 200° C., the erosion of the Ti film occurred in 70 hours when the Pt film 12c was absent, however, the erosion of the Ti film did not occur even after 300 hours.

The similar effect can be obtained even when a film formed of any of Pd, Ru, Ta, Ni, Mo, Rh, Os, and Ir is used in place of the Pt film 12c.

Third Embodiment

Figure 5:
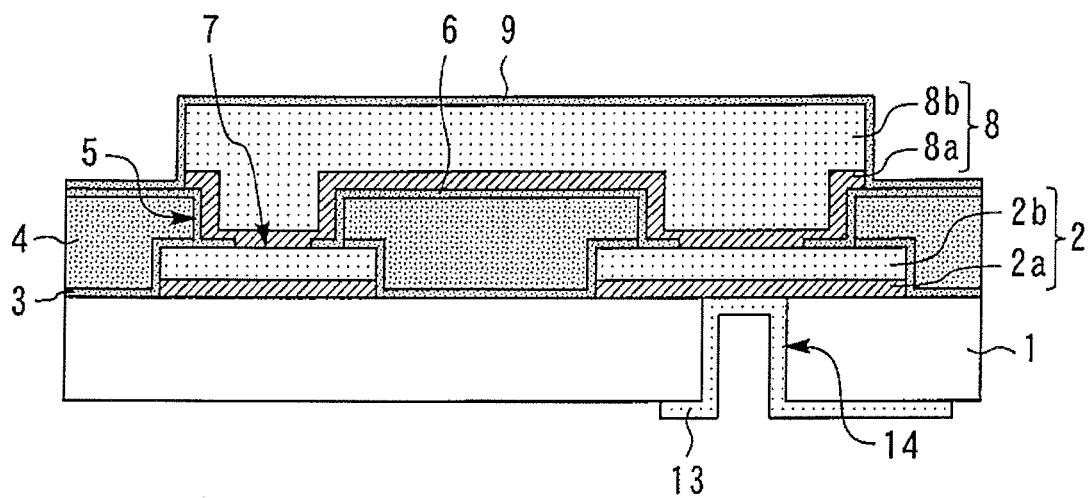
FIG. 5 is a sectional view showing a semiconductor device according to the third embodiment of the present invention.

FIG. 5 is a sectional view showing a semiconductor device according to the third embodiment of the present invention. On the back side of the GaAs substrate 1, a back side pad 13 is provided. The back side pad 13 is connected to the underlying wiring 2 through a via hole 14 penetrating the GaAs substrate 1. The SiN film 9 has no opening. Other constitutions are identical to the constitutions of the first embodiment.

Since the SiN film 9 on the front side has no opening, the invasion of impurities such as Br from the exterior can be inhibited, and the erosion of the Ti film 8a can be inhibited. Specifically, when the chip was stored in the Br atmosphere, although the erosion of the Ti film occurred from the surroundings of the opening when an opening was present on the SiN film 9, no erosion occurred when the opening was absent.

Fourth Embodiment

FIGS. 6 to 10 are sectional views showing the fabricating processes of the semiconductor device according to the fourth embodiment of the present invention. Referring to these drawings, methods for fabricating the semiconductor device according to the present embodiment will be described.

Figure 6:
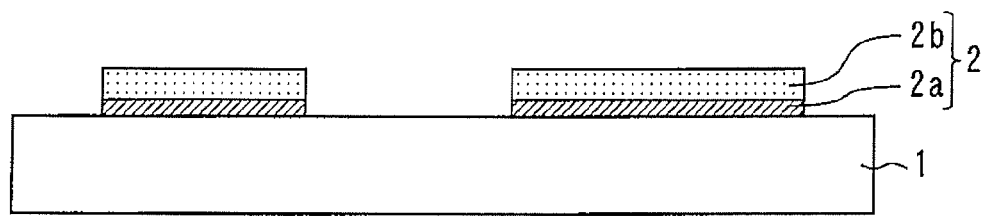
FIGS. 6 to 10 are sectional views showing the fabricating processes of the semiconductor device according to the fourth embodiment of the present invention.
Figure 7:
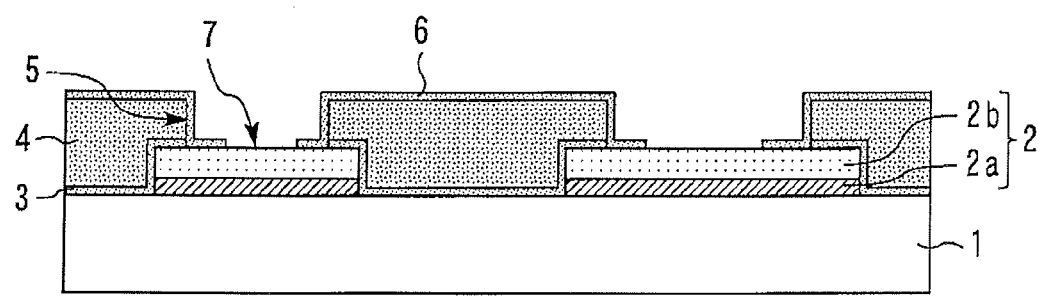

First, as shown in FIG. 6, an underlying wiring 2 is formed on the GaAs substrate 1. Next, as shown in FIG. 7, an SiN film 3 and a resin film 4 are formed on the GaAs substrate 1 and the underlying wiring 2, and an opening 5 is formed in the SiN film 3 and the resin film 4 on the underlying wiring 2. Then, an SiN film 6 is formed on the underlying wiring 2 and the resin film 4. Furthermore, in the opening 5, an opening 7 is formed in the SiN film 6.

Figure 8:
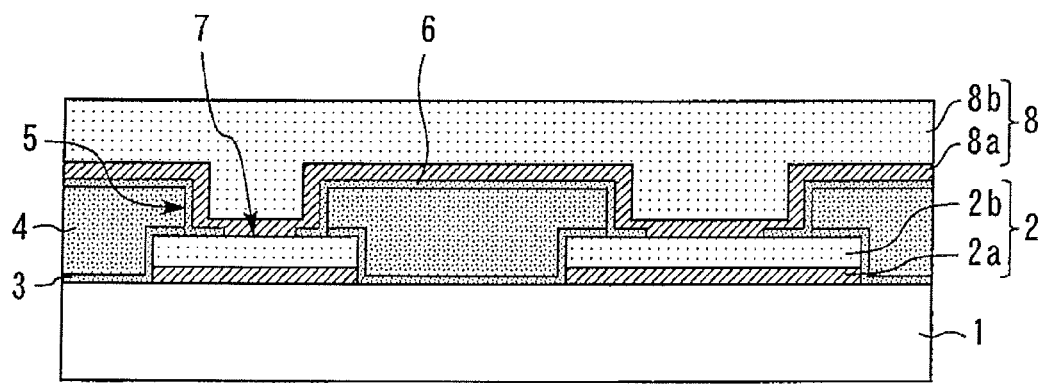

Next, as shown in FIG. 8, on the entire surfaces of the underlying wiring 2 and the resin film 4, an upper layer wiring 8 is formed by spattering. The upper layer wiring 8 has a Ti film 8a connected to the underlying wiring 2 via openings 5 and 7, and an Au film 8b provided on the Ti film 8a.

Figure 9:
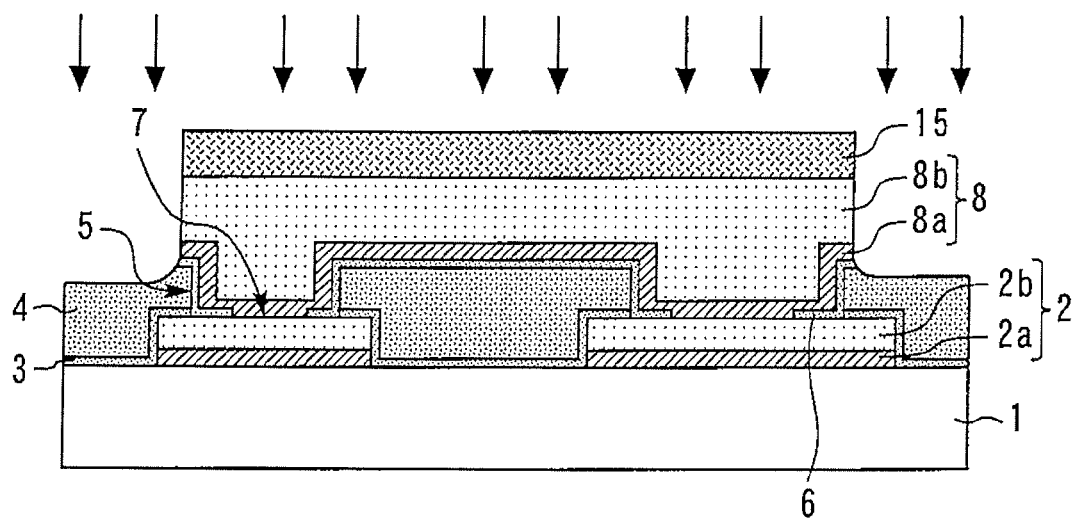

Next, as shown in FIG. 9, a resist film 15 is formed on the upper layer wiring 8, and patterned by photolithography or the like. Then, using the resist film 15 as a mask, the upper layer wiring 8 and the SiN film 6 are patterned by anisotropic etching. At this time, the surface layer portion of the resin film 4 is also etched.

Figure 10:
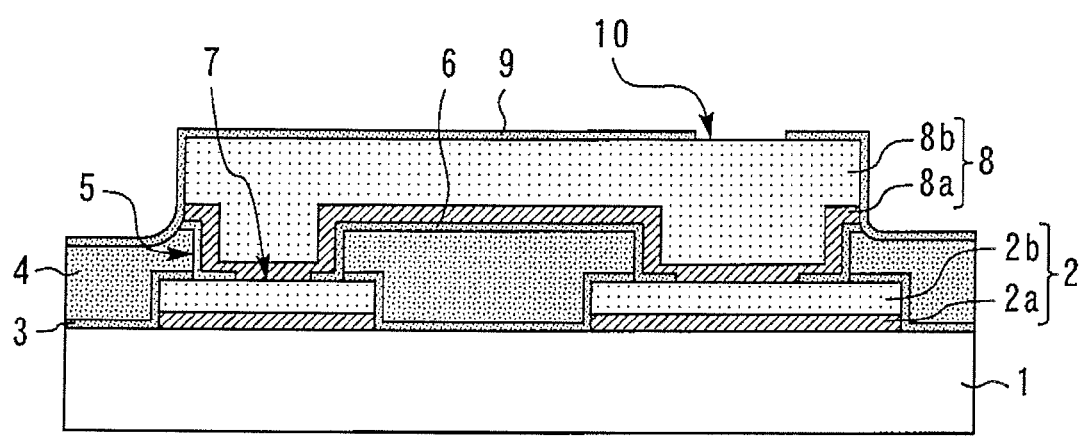

Next, as shown in FIG. 10, an SiN film 9 is formed on the patterned upper layer wiring 8 and the resin film 4. The SiN film 9 protects the side surface of the Ti film 8a. By the above-described processes, the semiconductor device according to the present embodiment is fabricated.

As described above, since the upper layer wiring 8 is formed on the entire surfaces of the underlying wiring 2 and the resin film 4, the coverage of the uneven surface of the opening 5 portion of the resin film 4 can be improved. Furthermore, since the circumference of the Ti film 8a is protected by the SiN films 6 and 9, the resistance to impurities or the like from the exterior can be improved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-224521, filed on Oct. 12, 2011, including specification, claims, drawings, and summary, on which the Convention priority of the present application is based, is incorporated herein by reference in its entirety.

What is claimed is:

1. A semiconductor device comprising:
    a semiconductor substrate;
    an underlying wiring on the semiconductor substrate;
    a resin film on the semiconductor substrate and the underlying wiring, and having a first opening extending to the underlying wiring;
    a first SiN film on the underlying wiring and the resin film, and having a second opening in the first opening;
    an upper layer wiring on the underlying wiring and only part of the resin film; and
    a second SiN film on the upper layer wiring and the resin film, and joined to the first SiN film on the resin film, wherein
        the upper layer wiring has a Ti film, connected to the underlying wiring via the first and second openings, and an Au film on the Ti film, and
        the first and second SiN films circumferentially protect the Ti film.

2. The semiconductor device according to claim 1, further comprising a metal pad, wherein
    the second SiN film has a third opening extending to the upper layer wiring, and
    the metal pad is connected to the upper layer wiring via the third opening.

3. The semiconductor device according to claim 2, wherein the metal pad has a pad Au film.

4. The semiconductor device according to claim 3, wherein
    the metal pad includes a pad Ti film connected to the upper layer wiring, and a pad metal film located between the pad Ti film and the pad Au film, and
    the pad metal film is selected from the group consisting of Pt, Pd, Ru, Ta, Ni, Mo, Rh, Os, and Ir.

5. The semiconductor device according to claim 1, further comprising a back side pad on a back side of the semiconductor substrate, and connected to the underlying wiring through a via hole penetrating the semiconductor substrate, wherein the second SiN film has no opening.

* * * * *